(12) United States Patent
Chen

(10) Patent No.: US 8,546,160 B2
(45) Date of Patent: Oct. 1, 2013

(54) METHOD FOR PACKAGING LIGHT EMITTING DIODES

(75) Inventor: Pin-Chuan Chen, Hukou (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/441,934

(22) Filed: Apr. 9, 2012

(65) Prior Publication Data

US 2012/0322179 A1    Dec. 20, 2012

(30) Foreign Application Priority Data

Jun. 14, 2011   (CN) .......................... 2011 1 0158988

(51) Int. Cl.
*H01L 33/62*   (2010.01)
*H01L 21/52*   (2006.01)

(52) U.S. Cl.
USPC ..................... 438/28; 438/112; 257/E21.51

(58) Field of Classification Search
USPC ............... 438/28, 112; 257/E21.51
See application file for complete search history.

(56) References Cited

U.S. PATENT DOCUMENTS

| | | | |
|---|---|---|---|
| 3,650,648 A | * | 3/1972 | Lambrecht ................. 425/129.1 |
| 2006/0193148 A1 | | 8/2006 | Bang |
| 2008/0048203 A1 | | 2/2008 | Son |
| 2012/0322179 A1 | * | 12/2012 | Chen ............................. 438/27 |

FOREIGN PATENT DOCUMENTS

| | | | |
|---|---|---|---|
| JP | 60024025 A | * | 2/1985 |
| TW | 200846749 A | | 12/2008 |

* cited by examiner

*Primary Examiner* — George Fourson, III
(74) *Attorney, Agent, or Firm* — Altis & Wispro Law Group, Inc.

(57) ABSTRACT

A method for packaging LEDs includes steps of: forming a substrate with a rectangular frame, a plurality of first and second electrode strips received within the frame and alternately arranged along a width direction of the frame; forming a carrier layer on each pair of the first and second electrode strips, the carrier layer defining a plurality of recesses; arranging an LED die in each recess and electrically connecting the LED die with first and second electrodes; forming an encapsulation in each recess to cover the LED die; and cutting the first and second electrode strips along the width direction of the frame to obtain a plurality of separated LED packages each including the first and second electrodes, the LED die, the encapsulation and a part of the carrier layer.

8 Claims, 8 Drawing Sheets

METHOD FOR PACKAGING LIGHT EMITTING DIODES

BACKGROUND

1. Technical Field

The present disclosure generally relates to a method for packaging light emitting diodes.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

During packaging process of the LEDs, a plurality of LED dies, electrodes, encapsulations, reflectors and so on, are mounted on a substrate which has a large estate area beforehand. Then, the substrate will be cut along different directions, for example along two perpendicular directions, whereby the components on the substrate and the substrate are divided into a plurality of individual LED packages. However, the complex cutting steps along different directions undesirably make the whole cutting process time consuming and increase cost of the LED packages.

Therefore, what is needed is to provide an LED packaging method capable of effectively overcoming the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED packaging method, in detail.

Figure 8:
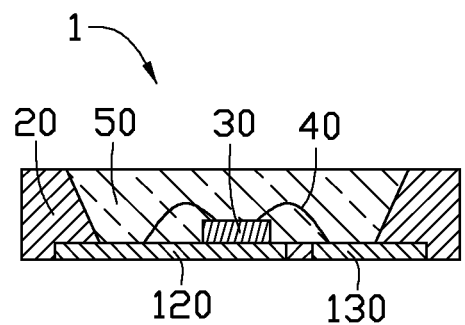
FIG. 8 is a cross section of a completed LED package.

Referring to FIG. 8, a completed LED package 1 according to the disclosure includes a first electrode 120, a second electrode 130, an LED die 30 arranged on the first electrode 120, a carrier layer 20 supporting the first and second electrodes 120, 130, and an encapsulation 50 covering the LED die 30. A method for forming the LED package 1 is disclosed here below. The carrier layer 20 can also function as a reflector for reflecting light generated by the LED die 30 to increase light extraction efficiency of the LED package 1.

Figure 1:
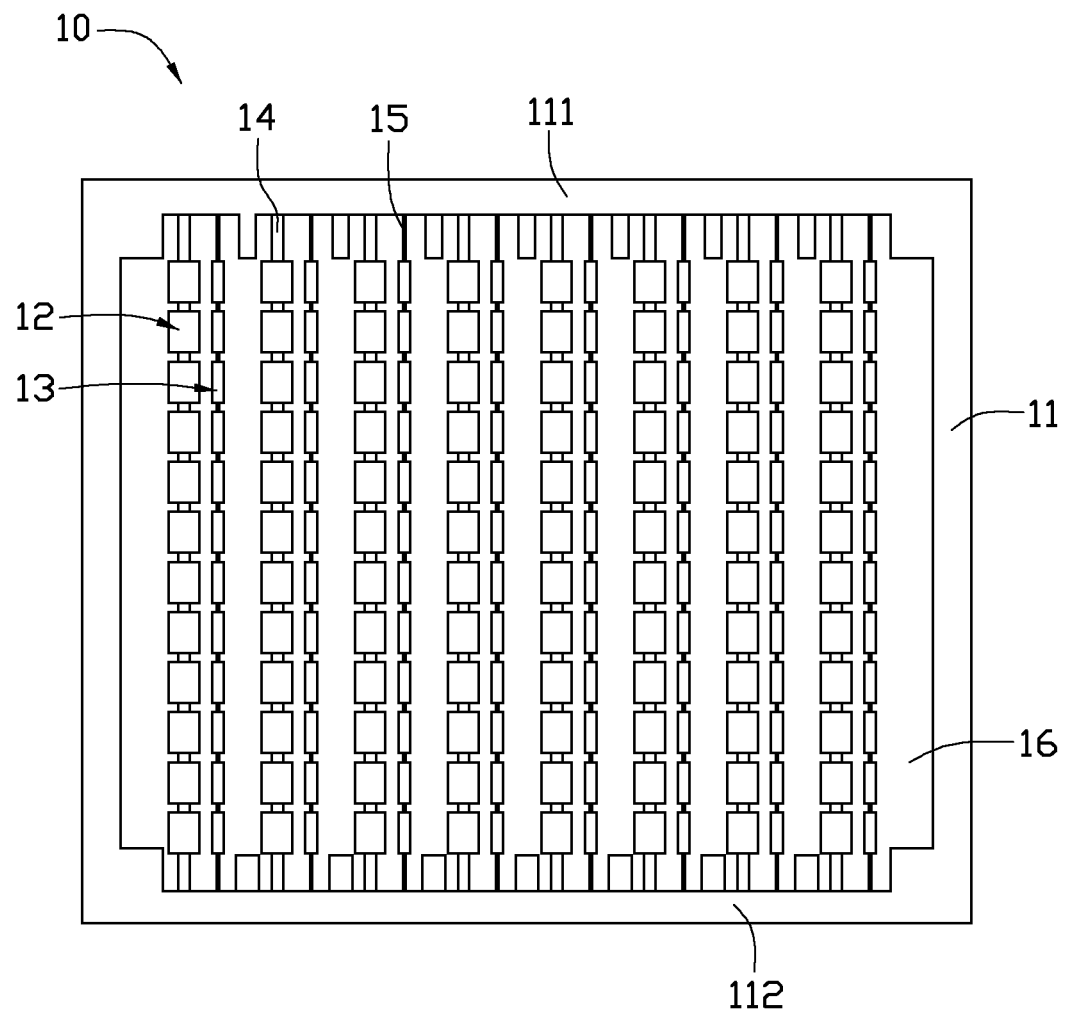
FIG. 1 is a top view of a substrate for packaging LEDs of the present disclosure.
Figure 2:
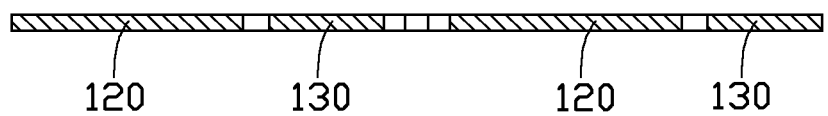
FIG. 2 is a partial cross section of the substrate of FIG. 1.

Firstly, referring to FIG. 1 and FIG. 2, a substrate 10 is provided. The substrate 10 includes a rectangular frame 11, a plurality of first electrode strips 12 and a plurality of second electrode strips 13, which are alternate with each other. The frame 11 includes a first side 111 and a second side 112 opposite to the first side 111. The frame 11 encloses the first electrode strips 12 and the second electrode strips 13. Each first electrode strip 12 sits adjacent to a corresponding second electrode strip 13, and neighboring first electrode strip 12 and second electrode strip 13 cooperatively form a pair of first and second electrode strips 12, 13.

In this embodiment, the frame 11 defines a width direction parallel to the first side 111 and the second side 112, and a length direction perpendicular to the first side 111 and the second side 112. The plurality of first electrode strips 12 and the plurality of the second electrode strips 13 are alternately arranged along the width direction of the frame 11, and each longitudinally extend along the length direction of the frame 11 with two distal ends connected to the first and second sides 111, 112. The first electrode strips 12 and second electrode strips 13 are parallel to and apart from each other. Accordingly, a plurality of gaps 16 is defined in the frame 11 and between the first electrode strips 12 and the second electrode strips 13 and between the rightmost second electrode strip 13 and a right side of the frame 11 and the leftmost first electrode strip 12 and a left side of the frame 11.

The substrate 10 can further include a plurality of first supporting portions 14 and a plurality of second supporting portions 15. The first and second supporting portions 14, 155 are alternately arranged along the width direction of the frame 11. The plurality of first supporting portions 14 are configured for interconnecting extremity ends of the first electrode strips 12 with the first side 111 and second side 112 of the frame 11. The plurality of second supporting portions 15 are configured for interconnecting extremity ends of the second electrode strips 13 with the first side 111 and second side 112 of the frame 11.

The above mentioned configuration of the substrate 10 can be formed by punching or etching of a metal sheet. In this embodiment, the configuration of the substrate 10 is formed by punching of a metal sheet.

Figure 3:
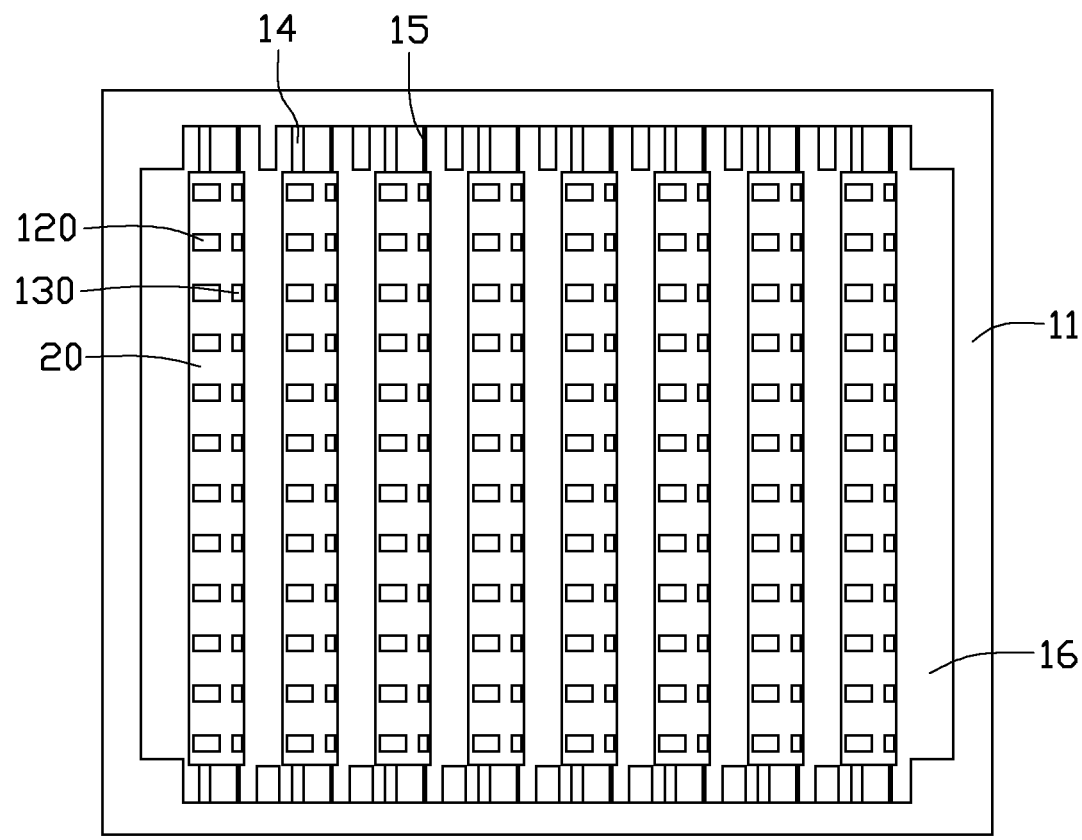
FIG. 3 is a top view of the substrate applied with a carrier layer.
Figure 4:
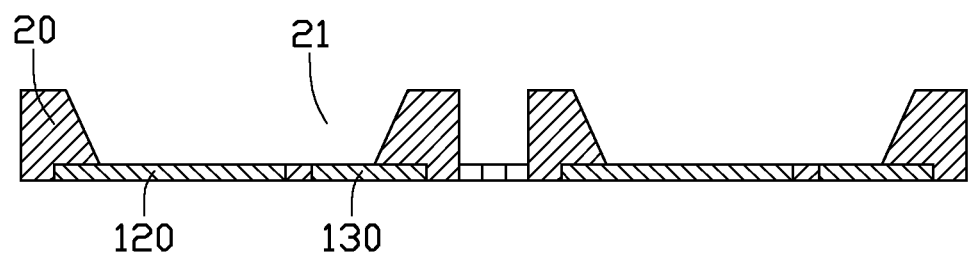
FIG. 4 is a partial cross section of the substrate of FIG. 3.

Secondly, referring to FIG. 3 and FIG. 4, a plurality of carrier layers 20 isolated from each other are formed on the substrate 10. Each carrier layer 20 has a bottom surface coplanar with a bottom of the substrate 10. Each carrier layer 20 sits on a corresponding pair of first and second electrode strips 12, 13. The corresponding first and second electrode strips 12, 13 of each pair are embedded in the carrier layer 20.

In this embodiment, the first electrode strip 12 of each pair comprises a plurality of first electrodes 120 along the length direction of the frame 11, and the second electrode strip 13 of each pair comprises a plurality of second electrodes 130 along the length direction of the frame 11 and corresponding to the first electrodes 120 in a one to one relationship. The carrier layer 20 defines a plurality of recesses 21 each corresponding to a pair of the first and second electrodes 120, 130. The first and second electrodes 120, 130 sit at lateral sides of the corresponding recess 21 and below the corresponding recess 21. The first and second electrodes 120, 130 have their upper surface exposed at a bottom of the recess 21. The recess 21 can be configured with a cup-like shape for receiving an LED die 30 therein. The carrier layer 20 can be made of resin, organic silicon, phenylpropanolamine or a composite thereof. The carrier layer 20 can be formed by molding.

Figure 5:
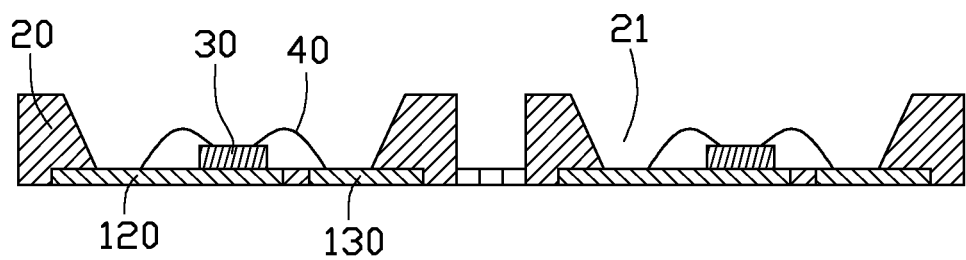
FIG. 5 is a partial cross section of the substrate of FIG. 3, mounted with LED dies.

Thirdly, referring to FIG. 5, at least one LED die 30 is arranged in each recess 21 and electrically connected to the corresponding first and second electrodes 120, 130. The at least one LED die 30 can be electrically connected to the corresponding first and second electrodes 120, 130 by flip chip, wire boding or eutectic bonding. In this embodiment, the LED die 30 is electrically connected to the corresponding first and second electrodes 120, 130 by metal wires 40.

Figure 6:
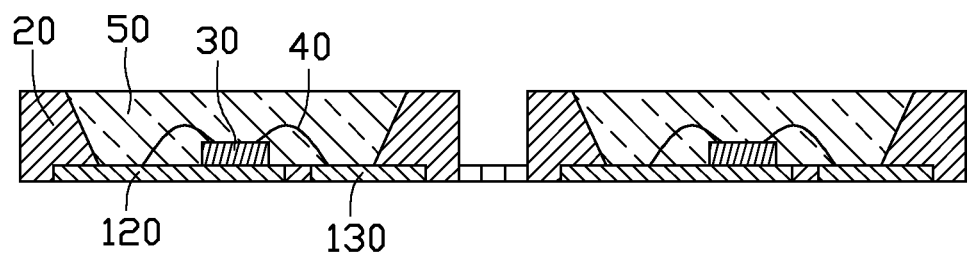
FIG. 6 is a partial cross section of the substrate of FIG. 3, mounted with LED dies and applied with encapsulations.

Fourthly, referring to FIG. 6, an encapsulation 50 is formed in each recess 21 to cover the at least one LED die 30. In this embodiment, the encapsulation 50 fills an entirety of the recess 21. The encapsulation 50 can further has fluorescent substance mixed therein, or fluorescent layer covered thereon.

Figure 7:
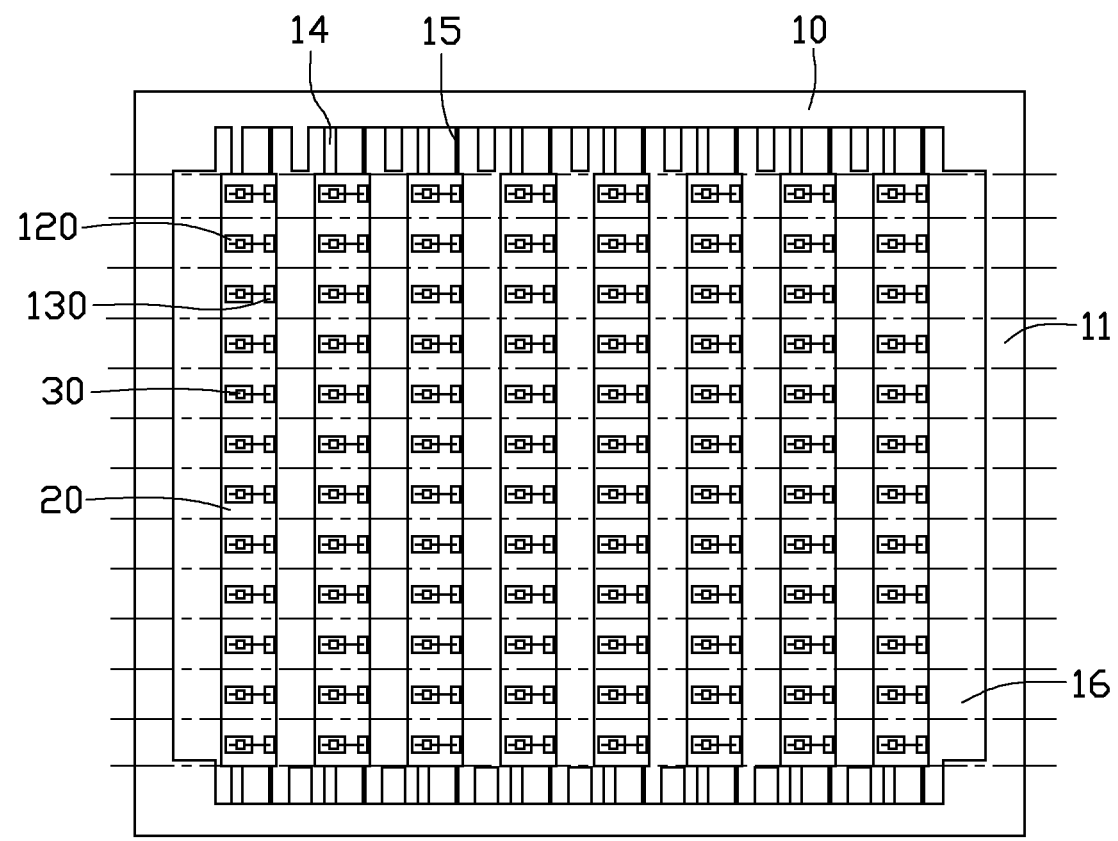
FIG. 7 is a top view of the substrate equipped with a carrier layer, LED dies and encapsulations.

Finally, referring FIG. 7, the substrate 10 equipped with the carrier layers 20, the LED dies 30 and the encapsulations 50 is cut along the width direction of the frame 11, which is illustrated by broken lines of FIG. 7.

Due to that the first and second electrode strips 12, 13 are alternately aligned along the width direction of the frame 11 and apart from each other, the simplex cut along the width direction of the frame 11 causes the substrate 10 which is equipped with the carrier layers 20, the LED dies 30 and the encapsulation 50 to be divided into a plurality of dices each having a configuration illustrated in FIG. 8 and each forming the LED package 1. The cutting action according to the disclosure only requires to operate along a simplex direction, which makes the LED packing process according to the disclosure be more easier and time and cost saving.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for packaging LEDs (light emitting diodes), comprising steps of:
    forming a substrate with a rectangular frame, a plurality of first electrode strips and a plurality of second electrode strips, the plurality of first and second electrode strips being located within the frame and alternately arranged along a width direction of the frame, the plurality of first and second electrode strips being parallel to and apart from each other, two neighboring first and second electrode strips forming as a pair first and second electrode strips, the first and second electrode strips each extending along a length direction of the frame and having two distal ends connected to the frame;
    forming a carrier layer on each pair of the first and second electrode strips, the first electrode strip of each pair comprising a plurality of first electrodes along the length direction of the frame, the second electrode strip of each pair comprising a plurality of second electrodes along the length direction of the frame and corresponding to the first electrodes in a one to one relationship, the carrier layer defining a plurality of recesses, a corresponding first electrode and a corresponding second electrode being exposed through one recess, the corresponding first and second electrodes being embedded in the carrier layer at lateral sides of said one recess;
    arranging at least one LED die in said one recess and electrically connecting the at least one LED die to the corresponding first and second electrodes;
    forming an encapsulation in said one recess to cover the at least one LED die;
    cutting the first and second electrode strips along the width direction of the frame to obtain a plurality of LED packages each comprising one of the first electrodes, one of the second electrode, the at least one LED die, the encapsulation and a part of the carrier layer.

2. The method for packaging LEDs of claim 1, wherein an extremity end of one of the first electrode strips is connected to the frame by a first supporting portion, and an extremity end of each of the second electrode strips is connected to the frame by a second supporting portion.

3. The method for packaging LEDs of claim 1, wherein the substrate is formed by punching or etching of a metal sheet.

4. The method for packaging LEDs of claim 1, wherein the carrier layer is made of resin, organic silicon, phenylpropanolamine or a composite thereof.

5. The method for packaging LEDs of claim 1, wherein the carrier layer is formed by molding.

6. The method for packaging LEDs of claim 1, wherein the at least one LED die is electrically connected to the corresponding first and second electrodes by flip chip, wire boding or eutectic bonding.

7. The method for packaging LEDs of claim 1, wherein the encapsulation has fluorescent substance mixed therein.

8. The method for packaging LEDs of claim 1, wherein a top surface of the encapsulation is covered by a fluorescent layer.

* * * * *